(12) United States Patent
Herman et al.

(10) Patent No.: US 9,600,038 B2
(45) Date of Patent: Mar. 21, 2017

(54) SYSTEMS AND METHODS FOR SECURING HIGH DENSITY SSDS

(71) Applicant: Skyera, LLC, San Jose, CA (US)

(72) Inventors: Pinchas Herman, Sunnyvale, CA (US); William Radke, Los Gatos, CA (US); Radoslav Danilak, Cupertino, CA (US)

(73) Assignee: Skyera, LLC, San Jose, CA (US)

( * ) Notice: Subject to any disclaimer, the term of this patent is extended or adjusted under 35 U.S.C. 154(b) by 187 days.

(21) Appl. No.: 14/086,057

(22) Filed: Nov. 21, 2013

(65) Prior Publication Data

US 2015/0138717 A1    May 21, 2015

(51) Int. Cl.
G06F 1/18    (2006.01)
H05K 7/14    (2006.01)

(52) U.S. Cl.
CPC .......... *G06F 1/181* (2013.01); *H05K 7/1487* (2013.01)

(58) Field of Classification Search
CPC ........ G06F 1/181; G06F 1/20; H05K 7/20145
USPC .......................... 361/679.49–679.51; 454/184
See application file for complete search history.

(56) References Cited

U.S. PATENT DOCUMENTS

| | | | | |
|---|---|---|---|---|
| 3,878,438 A * | 4/1975 | Weisman | ............. | H05K 7/1418 211/41.17 |
| 5,467,254 A * | 11/1995 | Brusati | ................ | H05K 7/1409 174/355 |
| 5,629,508 A * | 5/1997 | Findley, Jr. | .......... | G06Q 20/341 235/380 |
| 5,708,552 A * | 1/1998 | Han | ...................... | H05K 9/0016 361/220 |
| 6,346,003 B1 * | 2/2002 | Vilgiate | ............... | H05K 9/0016 361/799 |
| 6,456,500 B1 * | 9/2002 | Chen | ..................... | H05K 5/0278 361/736 |
| 6,999,309 B2 * | 2/2006 | Hsu | ......................... | G06F 1/187 312/223.1 |
| 7,337,261 B2 * | 2/2008 | Sukegawa | ............ | G06K 19/077 710/305 |
| 7,593,225 B2 * | 9/2009 | Sasagawa | ............... | G06F 1/187 165/104.33 |
| 7,625,250 B2 * | 12/2009 | Blackwell | ............ | H05K 7/1425 439/717 |

(Continued)

OTHER PUBLICATIONS

International Search Report and Written Opinion for International Application No. PCT/US2014/066815 mailed Feb. 16, 2015 (10 pgs.).

(Continued)

*Primary Examiner* — David M Sinclair
*Assistant Examiner* — Robert Brown
(74) *Attorney, Agent, or Firm* — McDermott Will & Emery LLP

(57) ABSTRACT

In various embodiments, a high-density solid-state storage unit includes a base section and a cassette section having plurality of flash cards. The cassette section can be removably attached to the base section to provide security of data stored on the plurality of flash cards. The cassette section provides for physical security of the flash cards in part through packaging of the enclosure and energy transfer to the base station. The cassette section further provides for security of the data stored on the flash cards in part through a trusted platform module (TPM) embodied as a removable module connected to a universal serial bus (USB) style connector.

15 Claims, 11 Drawing Sheets

(56) References Cited

U.S. PATENT DOCUMENTS

| | | | |
|---|---|---|---|
| 7,771,215 B1* | 8/2010 | Ni | G06K 19/07 439/131 |
| 7,984,303 B1* | 7/2011 | Ma | G06F 21/32 713/182 |
| 8,191,841 B2* | 6/2012 | Jeffery | G11B 33/02 165/104.13 |
| 8,446,729 B2* | 5/2013 | Schuette | G06F 3/0626 235/441 |
| 8,462,502 B2* | 6/2013 | Hirano | G06F 1/187 312/223.2 |
| 8,724,336 B2* | 5/2014 | Hanna | G06F 1/185 361/727 |
| 8,743,549 B2* | 6/2014 | Frink | G06F 1/187 361/679.49 |
| 8,868,898 B1* | 10/2014 | Van Hoof | G06F 21/575 710/200 |
| 9,304,557 B2 | 4/2016 | Herman et al. | |
| 2005/0007732 A1* | 1/2005 | Hsu | G06F 1/187 361/679.38 |
| 2005/0099771 A1* | 5/2005 | Wei | H04Q 1/15 361/694 |
| 2006/0146492 A1* | 7/2006 | Reents | G06F 1/181 361/679.37 |
| 2007/0112981 A1* | 5/2007 | Hernandez | G06F 21/31 710/62 |
| 2007/0247804 A1* | 10/2007 | Li | G11B 33/126 361/679.48 |
| 2008/0024997 A1 | 1/2008 | Ghantiwala | |
| 2009/0200367 A1* | 8/2009 | Arnouse | G06F 15/02 235/375 |
| 2009/0300753 A1* | 12/2009 | Lin | G06F 21/34 726/16 |
| 2010/0061070 A1* | 3/2010 | Koh | H05K 1/189 361/764 |
| 2010/0095113 A1* | 4/2010 | Blankenbeckler | G06Q 20/3829 713/155 |
| 2010/0172087 A1* | 7/2010 | Jeffery | G11B 33/02 361/679.33 |
| 2010/0290604 A1* | 11/2010 | Wright | H05K 13/0023 379/102.04 |
| 2010/0316219 A1* | 12/2010 | Boubion | G02B 21/16 380/259 |
| 2011/0141874 A1* | 6/2011 | Starr | H05K 7/1487 369/212 |
| 2011/0235272 A1* | 9/2011 | Bash | H05K 7/20609 361/692 |
| 2012/0026674 A1* | 2/2012 | Aldridge | G06F 1/187 361/679.33 |
| 2012/0081856 A1* | 4/2012 | Hopkins | G06F 1/187 361/679.33 |
| 2012/0113582 A1* | 5/2012 | Hirano | G06F 1/187 361/679.33 |
| 2012/0134096 A1* | 5/2012 | Zhang | H05K 7/1491 361/679.33 |
| 2012/0194983 A1* | 8/2012 | Kuster | G06K 19/07732 361/679.01 |
| 2012/0275104 A1* | 11/2012 | Hamand | H05K 7/1489 361/679.31 |
| 2012/0303854 A1* | 11/2012 | Karslioglu | G06F 13/36 710/306 |
| 2013/0050955 A1* | 2/2013 | Shinsato | G06F 1/181 361/727 |
| 2013/0264027 A1 | 10/2013 | Eckberg et al. | |
| 2013/0271671 A1* | 10/2013 | Sogabe | G06F 1/16 348/731 |
| 2014/0040524 A1* | 2/2014 | Luck | G06F 1/181 710/306 |
| 2014/0063721 A1* | 3/2014 | Herman | G06F 1/20 361/679.31 |
| 2014/0104769 A1* | 4/2014 | Wang | G06F 1/181 361/679.4 |
| 2014/0141654 A1* | 5/2014 | Wig | G06F 13/00 439/656 |
| 2015/0077922 A1 | 3/2015 | Herman et al. | |

OTHER PUBLICATIONS

International Search Report and Written Opinion for International Application No. PCT/US2014/066815 mailed Feb. 16, 2015 (10 pages).

* cited by examiner

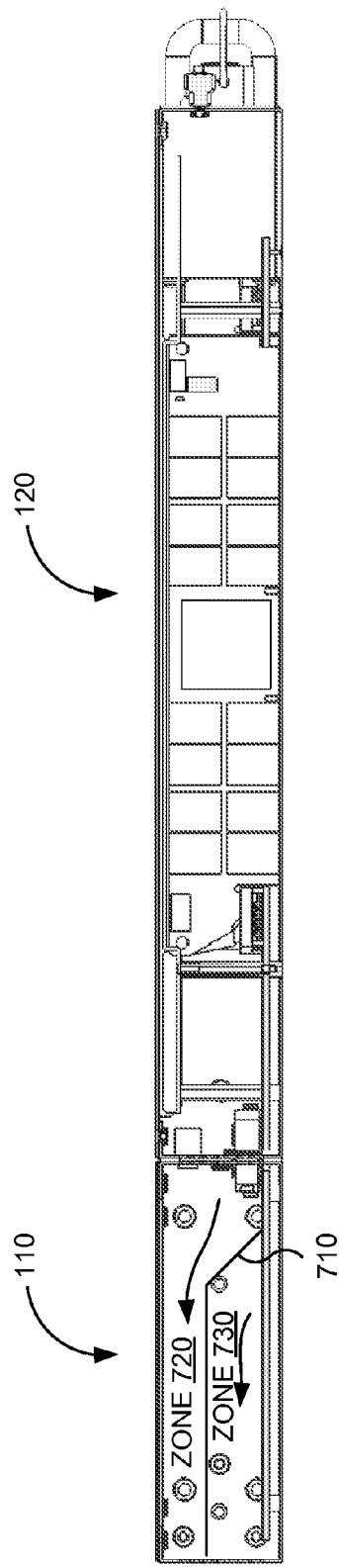

SYSTEMS AND METHODS FOR SECURING HIGH DENSITY SSDS

BACKGROUND OF THE INVENTION

Information technology is in the throes of a dramatic transformation. Virtualization is giving way to cloud computing; the ubiquity of powerful handheld devices is creating new paradigms in mobility and social interaction; the massive profusion of information generation is leading to powerful new opportunities for Big Data analytics. Cloud computing has been called "a disruptive force" with the potential for long-term impact on most industries.

Additionally, nowhere is this need for next-generation performance and capacity more critical than in enterprise storage solutions. Organizations are creating more data than ever before and data generation is growing at a staggering rate.

It's not just storage capacity that's a challenge to computing's new paradigm: Speed and performance are equally crucial. Organizations must be able to access their most important data as quickly as possible to act upon it effectively. They need solutions that minimize latency, maximize input/output operations per second (IOPS) and deliver maximum capacity and performance in a cost-efficient manner. Otherwise the cost of delivering sufficient storage capacity and performance will cripple this new computing paradigm before it ever gets its sealegs.

The storage industry has made great strides in adapting technology to deliver more capacity and better performance without congruent increases in costs. Solutions such as compression, deduplication and intelligent tiering have made today's disk storage systems far more efficient and have enabled the widespread proliferation of virtualization that has set the stage for the transition to cloud computing.

But those solutions go just so far: Spinning disk storage has practical limitations in speed and performance. The real promise for next-generation performance has always been in solid-state technology. Solid-state technology employs nonvolatile flash memory so there are no moving parts, meaning solid-state solutions operate much faster than traditional disk drives in reading and writing data. A single enterprise-grade solid-state solution can handle a transaction workload of 100 traditional hard drives—with more reliability and less power consumption in a much smaller physical space.

Most of the leading enterprise storage vendors incorporate solid-state technology as part of their overall solutions, but in limited capacities usually targeted for specific, storage-intensive production applications that require very high levels of performance: Video editing, computer-aided design and high-end online transaction processing systems (OLTPs) are some of the obvious choices.

The challenge in deploying solid-state technology more ubiquitously across the enterprise—for all enterprise applications—has been one of cost. Although NAND Flash solutions could deliver 100 times the performance of traditional spinning disks—at one tenth the power consumption—they have also been about 10 times more expensive to deploy.

Simply, the cost of deploying robust enterprise-grade solid-state technology has been too high for widespread deployment across all enterprise applications. However, that excuse will not suffice for the future, as the performance level ensured by solid-state technology becomes even more critical for all applications across all types of businesses.

The reality is that the capacity and performance of solid-state technology will be a necessary part of next-generation data center infrastructures if these infrastructures are to deliver on the promise of cloud computing, Big Data and all of the other critical aspects of computing's next era. Enterprise-grade solid-state technology will be crucial to the underlying storage infrastructure—driving all enterprise applications—to meet ever-changing requirements for performance, speed, capacity, and agility.

Next-generation solid-state technology for the enterprise must be robust, reliable, fully featured, and cost-efficient: It must go beyond what is available in solid-state today, particularly when IT decision-makers think about typical solid-state drives (SSDs) that use HDD protocols to speak to the rest of the world. This deployment of solid-state technology has been useful in their initial applications, such as in laptop computing, but is nowhere near the right design for true enterprise-grade solid-state storage. The challenge to the storage industry has been to figure out how to deliver enterprise-grade performance and reliability in solid-state technology at a reasonable cost for widespread enterprise appeal.

Accordingly, what is desired is to solve problems relating to packaging and security of solid-state storage units, some of which may be discussed herein. Additionally, what is desired is to reduce drawbacks relating to packaging and security of solid-state storage units, some of which may be discussed herein.

BRIEF SUMMARY OF THE INVENTION

The following portion of this disclosure presents a simplified summary of one or more innovations, embodiments, and/or examples found within this disclosure for at least the purpose of providing a basic understanding of the subject matter. This summary does not attempt to provide an extensive overview of any particular embodiment or example. Additionally, this summary is not intended to identify key/critical elements of an embodiment or example or to delineate the scope of the subject matter of this disclosure. Accordingly, one purpose of this summary may be to present some innovations, embodiments, and/or examples found within this disclosure in a simplified form as a prelude to a more detailed description presented later.

In various embodiments, a high-density solid-state storage unit includes a base section and a cassette section having a plurality of flash cards. The cassette section can be removably attached to the base section to provide security of data stored on the plurality of flash cards. The cassette section provides for physical security of the flash cards in part through packaging of the enclosure and energy transfer to the base station. The cassette section further provides for security of the data stored on the flash cards in part through a trusted platform module (TPM) embodied as a removable module connected to a universal serial bus (USB) style connector.

In one aspect, a data storage unit includes a base section and a cassette section. The cassette section is configured to be removably attached to the base section. The cassette section includes an interface through which a plurality of solid-state storage modules located within the cassette section are accessible to the base section. A trusted platform module is removably attached to the cassette section utilizing a universal serial bus (USB) style connector. The trusted platform module is configured to manage access to data stored in the plurality of solid-state storage modules from the base section.

In one embodiment, the interface of the cassette section is configured to provide both an electrical connection between the cassette section and the base section as well as energy transfer from the cassette section to the base section. The interface transfers vibrations and other mechanical energies from the cassette section to the base station reduce the potential for physical damage to the cassette section and any components therein.

In another aspect, the cassette section further includes one or more guides. The guides are configured to assist with insertion of the cassette section into the base section. Each guide has a taper from one end of the cassette section toward another end of the cassette section. The taper is configured to provide self-guiding of the cassette section upon insertion into the base section. The one or more guides may be configured to provide energy transfer to the base section and the base section may be configured to receive the energy transfer through the one or more guides. The one or more guides may further include a first wedge receptor opposite a second wedge receptor to assist with initial insertion.

In further embodiments, the cassette section includes various gap filling materials. A gap filling material may be placed between one or more internal components of the cassette section and an enclosing plate of the cassette section. A gap filling material may account for variation in the manufacturing process. A gap filling material may further be configured to reduce vibration of the cassette section.

In some aspects, the base section includes one or more structures forming a plurality of environmental zones. At least one of the plurality of environmental zones may be designated for the cassette section.

In another embodiment, a data cassette includes a plurality of solid-state storage modules, a first interface, and a second interface. The first interface includes circuitry through which the plurality of solid-state storage modules located within the data cassette are accessible to a base section. The second interface includes circuitry configured to accept a removable trusted platform module utilizing a universal serial bus (USB) style connector. The trusted platform module is configured to manage access to data stored in the plurality of solid-state storage modules from the base section.

In a further embodiment, a trusted platform module includes an interface having a universal serial bus (USB) style connector configured to be inserted into to a cassette section having a plurality of plurality of solid-state storage modules. The trusted platform module further includes circuitry configured to manage access to data stored in the plurality of solid-state storage modules from the base section.

In some aspects, the interface is configured as a USB 2.0 or 3.0 Standard-A type plug with a flattened rectangle that inserts into a USB 2.0 or 3.0 Standard-A type plug receptacle of the cassette section. The circuitry may be configured to manage access to the data stored in the plurality of solid-state storage modules from the base section utilizing circuitry configured to provide platform integrity. The circuitry may be configured to manage access to the data stored in the plurality of solid-state storage modules from the base section utilizing circuitry configured to manage encryption keys for the data stored in the plurality of solid-state storage modules. The circuitry may be configured to manage access to the data stored in the plurality of solid-state storage modules from the base section utilizing circuitry configured to manage both the data and metadata stored in the plurality of solid-state storage modules.

A further understanding of the nature of and equivalents to the subject matter of this disclosure (as well as any inherent or express advantages and improvements provided) should be realized in addition to the above section by reference to the remaining portions of this disclosure, any accompanying drawings, and the claims.

BRIEF DESCRIPTION OF THE DRAWINGS

In order to reasonably describe and illustrate those innovations, embodiments, and/or examples found within this disclosure, reference may be made to one or more accompanying drawings. The additional details or examples used to describe the one or more accompanying drawings should not be considered as limitations to the scope of any of the claimed inventions, any of the presently described embodiments and/or examples, or the presently understood best mode of any innovations presented within this disclosure.

FIG. 7 is a diagram illustrating a cross section of the cassette of FIG. 3 having dual temperature zones in one embodiment of the present invention.

DETAILED DESCRIPTION OF THE INVENTION

In various embodiments, a high-density solid-state storage unit includes a base section and a cassette section having plurality of flash cards. The cassette section can be removably attached to the base section to provide security of data stored on the plurality of flash cards. The cassette section provides for physical security of the flash cards in part through packaging of the enclosure and energy transfer to the base station. The cassette section further provides for security of the data stored on the flash cards in part through a trusted platform module (TPM) embodied as a removable module connected to a USB connector.

INTRODUCTION

Figure 1:
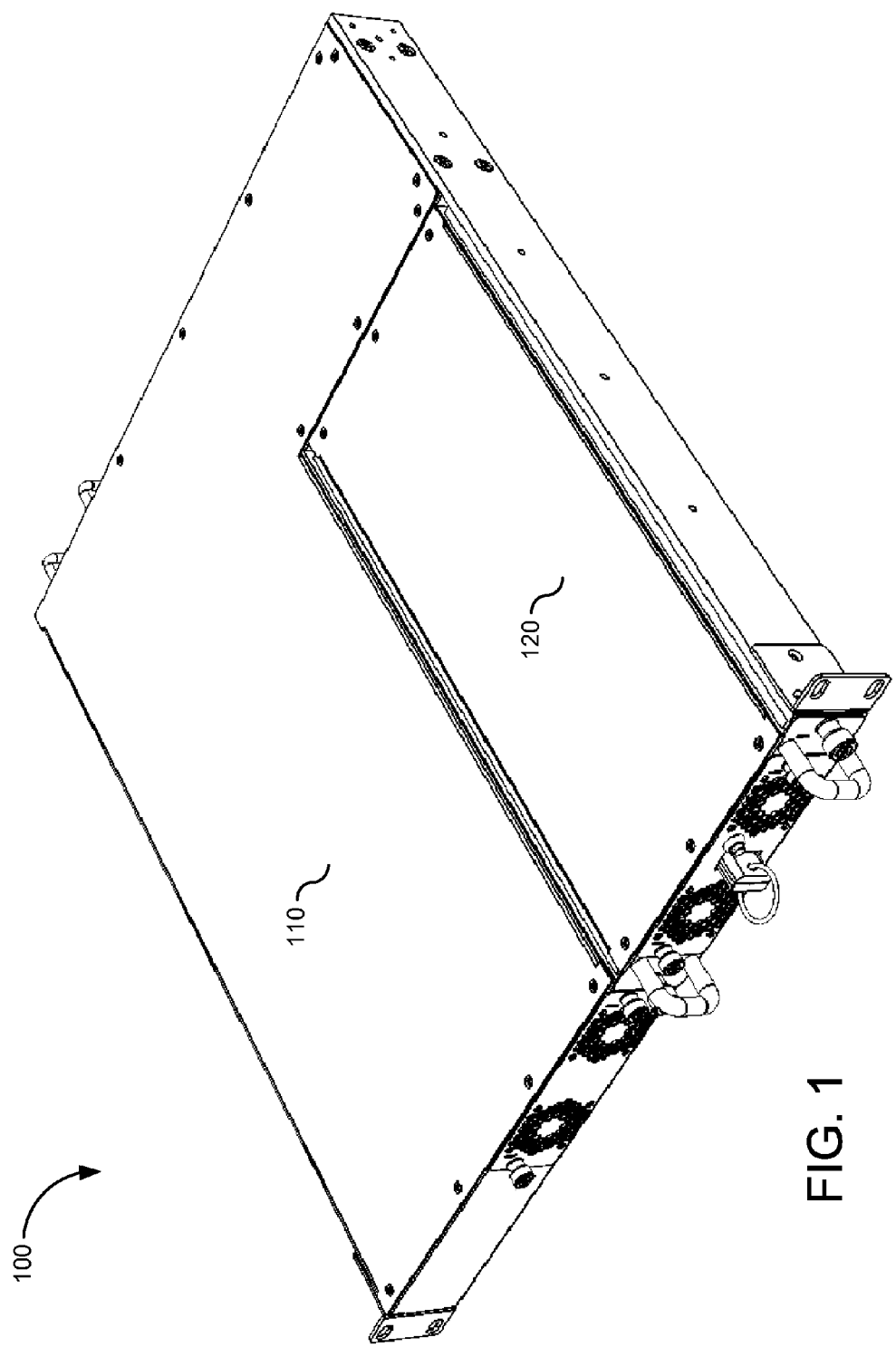
FIG. 1 is a diagram of a high-density solid-state storage unit having a base and a cassette in one embodiment according to the present invention.

FIG. 1 is a diagram of high-density solid-state storage unit 100 having a base and a cassette in one embodiment according to the present invention. High-density solid-state storage unit 100 may be embodied as an all-Flash enterprise solid-state storage system. Examples of high-density solid-state storage unit 100 can be embodied similar to products provided by Skyera Inc. of San Jose, Calif.

Solid-state storage unit 100 typically includes two components in which hardware and/or software elements are arranged, base section 110 and cassette section 120. Base section 110 and cassette section 120 can include elements and components typically found within consumer and enterprise grade computers and storage equipment. This may include one or more processors having one or more cores, memories, busses and interfaces, power systems, ventilation systems, and the like. Solid-state storage unit 100 is typically constructed from steel, aluminum, plastics, or other alloys and materials typically used in consumer or enterprise grade hardware.

Solid-state storage unit 100 may be embodied similar to conventional server storage units that include hard-drive based or similar storage devices. Solid-state storage unit 100 may be configured for installation into one or more server racks. Server rack generally can hold multiple pieces of rack-mountable units that are designed to fit in the server rack. Each rack-mountable unit can generally be one of several standard dimensions measured in terms or a 'rack unit.' A rack unit, U or RU is a unit of measure used to describe the height of equipment intended for mounting in a 19-inch rack or a 23-inch rack. The 19-inch (48.26 cm) or 23-inch (58.42 cm) dimension refers to the width of the equipment mounting frame in the rack, i.e. the width of the equipment that can be mounted inside the rack. One rack unit (1U) is 1.75 inches (44.45 mm) high. The size of a piece of rack-mounted equipment is frequently described as a number in "U". For example, one rack unit is often referred to as "1U", 2 rack units as "2U" and so on.

High-density solid-state storage 100 may also be embodied as any computing device, such as a personal computer (PC), a workstation, a mini-computer, a mainframe, a cluster or farm of computing devices, a laptop, a notebook, a netbook, a PDA, a smartphone, a consumer electronic device, a gaming console, or the like.

In general, base section 110 is configured to control and manage the operation of solid-state storage unit 100 with respect to external access to data stored in cassette section 120. In various embodiment, base section 110 may include one or more central processing units (CPUs), memories, and interfaces. Base section 110 includes hardware and/or software elements configured for performing logic operations and calculations, input/output operations, machine communications, or the like. Base section 110 may include familiar computer components, such as one or more data processors, one or more graphics processors or graphical processing units (GPUs), one or more memory subsystems, one or more storage subsystems, one or more input/output (I/O) interfaces, communications interfaces, or the like. Base section 110 can include one or more systems interconnecting components and providing functionality, such connectivity and inter-device communication.

In various embodiments, base section 110 may include software that enables communications over a network, such as a local area network or the Internet, using one or more communications protocols, such as the HTTP, TCP/IP, RTP/RTSP protocols, or the like. In some embodiments, other communications software and/or transfer protocols may also be used, for example IPX, UDP or the like, for communicating with hosts over the network or with a device directly or indirectly connected to base section 110. In further embodiments, base section 110 may include software that enables network attached storage (NAS) communications, direct attached storage (DAS) communications, storage area network (SAN) communications, or the like. In some embodiments, other data storage software, transfer protocols, or interconnets may also be used, for example ATA over Ethernet (AoE) mapping of ATA over Ethernet, Fibre Channel Protocol (FCP) mapping of SCSI over Fibre Channel, Fibre Channel over Ethernet (FCoE), ESCON over Fibre Channel (FICON), HyperSCSI mapping of SCSI over Ethernet, iFCP or SANoIP mapping of FCP over IP, iSCSI mapping of SCSI over TCP/IP, iSCSI Extensions for RDMA (iSER) mapping of iSCSI over InfiniBand, storage networks may also be built using SAS and SATA technologies, or the like.

In some embodiments, base section 110 may maintain a variety of temperature zones using one or more techniques described in detail below.

In general, cassette section 120 is configured to manage access to data stored in a plurality of storage modules located within cassette section 120. Cassette section 120 may include one or more central processing units (CPUs), memories, and interfaces. Cassette section 120 may include hardware and/or software elements configured for performing logic operations and calculations, input/output operations, machine communications, or the like. Cassette section 120 may include familiar computer components, such as one or more data processors, one or more graphics processors or graphical processing units (GPUs), one or more memory subsystems, one or more storage subsystems, one or more input/output (I/O) interfaces, communications interfaces, or the like. Cassette section 120 can include one or more systems interconnecting components and providing functionality, such connectivity and inter-device communication.

In various embodiments, cassette section 120 is configured to be removably attached to base section 110. This allows cassette section 120 to be physically removed from base section 110 to provide enhanced data security. Cassette section 120 can be physically secured to further prevent unauthorized access to the data stored thereon. Cassette section 120 may be configured to be insertable only in corresponding base section 110 or cassette section 120 may be configured to be insertable into any compatible base section. In some embodiments, cassette section 120 is configured to rely upon or otherwise utilize hardware and/or software elements of base section 110 that are configured for performing logic operations and calculations, input/output operations, machine communications, or the like.

Cassette section 120 typically includes multiple storage modules. A plurality of storage modules may be arranged side-by-side. The plurality of storage modules may be arranged in a vertical orientation extending from a shared circuit board. Each storage module preferably includes solid-state memory that can provide between 8 and 10 terabytes of storage capacity. One skilled in the art will realize that the amount of storage capacity on each storage module is primarily limited by the available capacity of memory devices. Advances in solid-state memory technology will result in a single memory device being able to hold terabytes of data in the near future. At such time, the storage capacity of each memory module can be greatly enhanced by using such high-capacity memory devices. Therefore, the memory capacity numbers described above are based on the technology available today. These numbers are provided merely as an example and should not be construed as limiting the claimed invention in any manner. One skilled in the art will realize that the storage capacity can be increased further using the concepts described in this application as newer technology is available in the future.

Figure 2A:
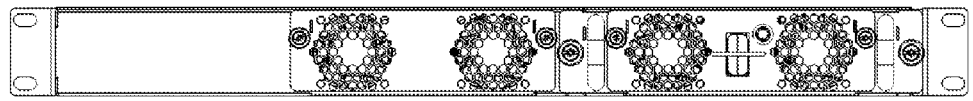
FIGS. 2A-2F are different views illustrating the high-density solid-state storage unit of FIG. 1 in one embodiment according to the present invention.

FIGS. 2A-2F are different views illustrating high-density solid-state storage unit 100 of FIG. 1 in one embodiment according to the present invention. In this example, FIG. 2A depicts a front view of high-density solid-state storage unit 100. As can be seen, base section 110 includes one or more vents at which one or more fans may be mounted to blow air inwards into base section 110, for example, to support cooling of internal electronics. Cassette section 120 includes one or more vents at which one or more fans may be mounted to blow air inwards into cassette section 110, for example, to support cooling of internal electronics and the multiple storage modules.

Cassette section 120 may include one or more physical mechanisms for being physically secured, connected, or coupled to base section 110. For example, FIG. 2A illustrates one or more screws for securing cassette section 120 to base section 110. Cassette section 120 may include one or more guides, rails, tracks, of other features that facilitate how cassette section 120 is secured to base section 110. In some aspects, an interface between cassette section 120 and base section of a securing mechanism may serve multiple purposes, such as providing an electrical connection as well as providing energy transfer for reducing or dampening vibration in cassette section 120.

Figure 2B:

FIG. 2B depicts a back view of high-density solid-state storage unit 100 opposing the front view of FIG. 2A. As can be seen, base section 110 includes one or more vents at which one or more fans may be mounted to blow air outwards from base section 110. Base section 110 may include one or more interfaces, such as ethernet, universal serial bus (USB), monitor ports, and the like that facilitate connections to external components. Base section 110 may further include one or more power supplies in a variety of known configurations.

Figure 2C:
Figure 2D:
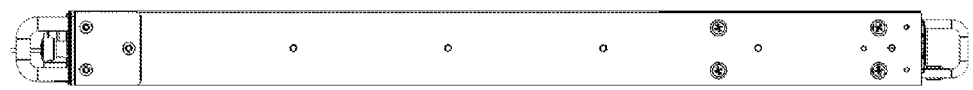
Figure 2E:
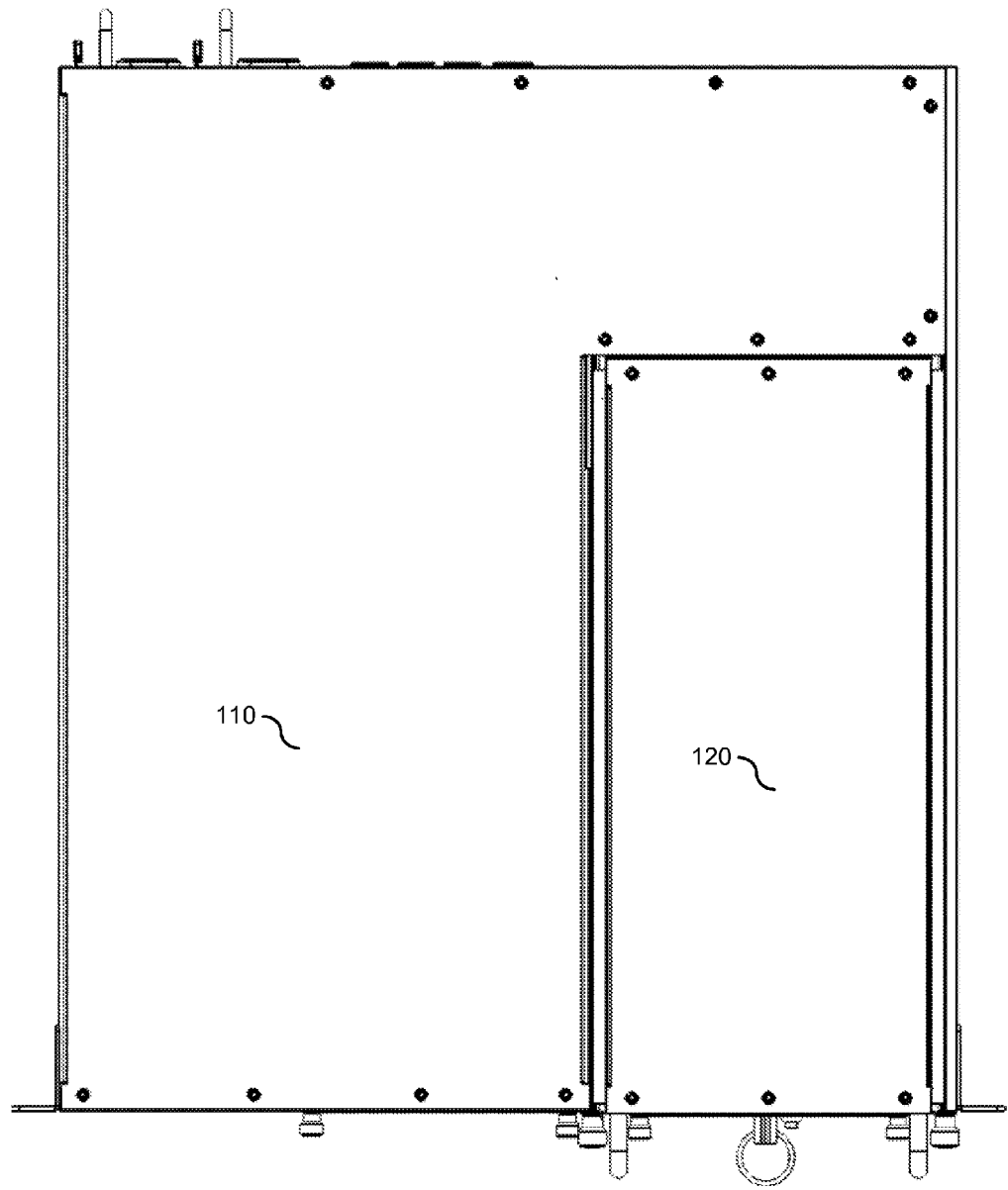
Figure 2F:
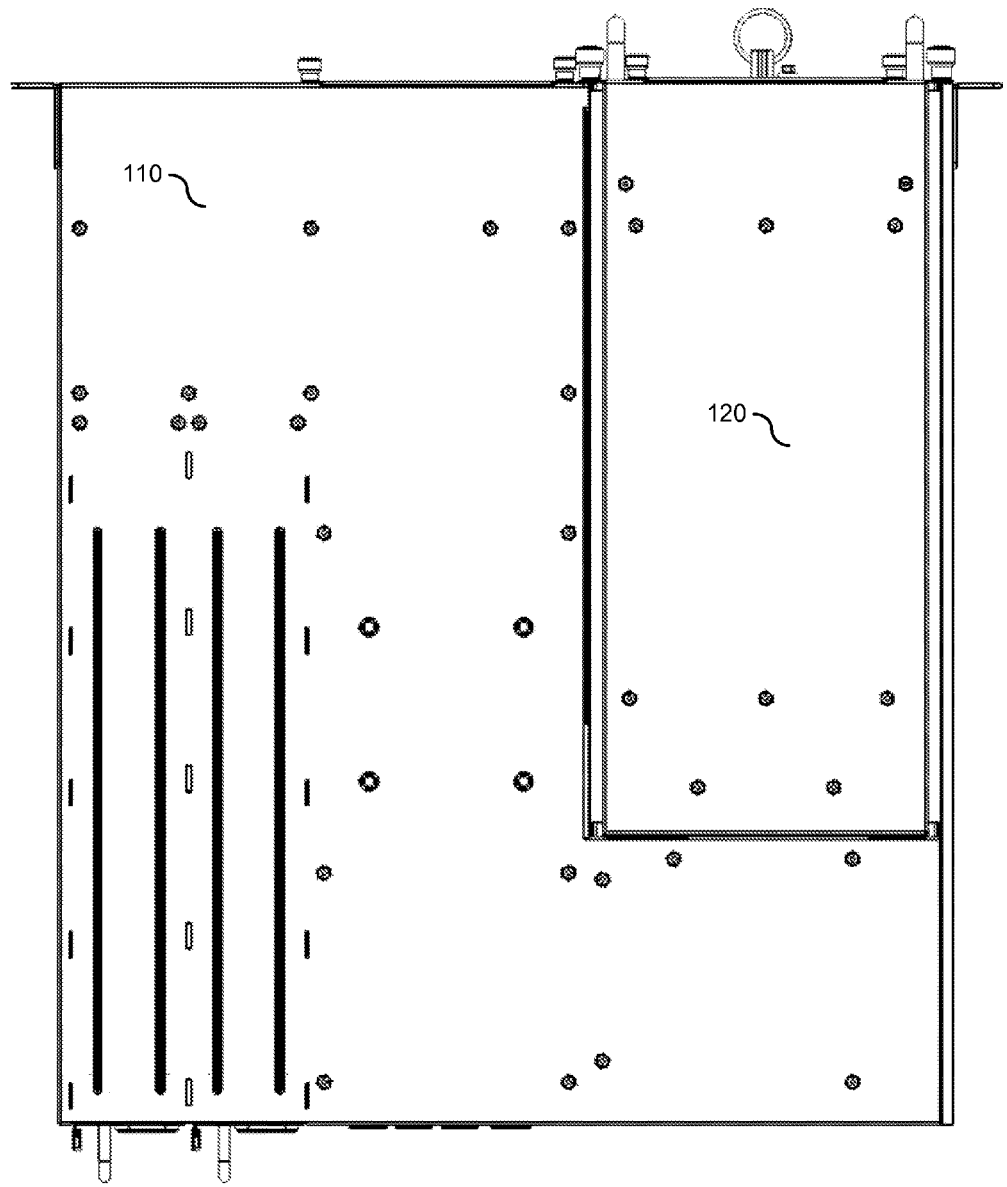

FIG. 2C depicts a left view of high-density solid-state storage unit 100. Base section 110 may include one or more openings, interfaces, and the like that allow base section 110 to be secured to a rack or cabinet for operation. FIG. 2D depicts a right view of high-density solid-state storage unit 100. FIG. 2E depicts a top view of high-density solid-state storage unit 100. FIG. 2F depicts a bottom view of high-density solid-state storage unit 100.

In these example, it is more clearly illustrated to removable nature of cassette section 120 from base section 110. Allowing cassette section 120 to be easily removed from base section 110 provides a variety of advantages. Traditionally, hard drives provide the medium for removable storage. However, even though the density of hard drives has increased, their volume or form factor has remained the same. Cassette section 120 provides high density storage with the benefit of removability for the added protection of the data stored thereon.

Removability of cassette section 120 from base section 110 also provides challenges some of which are discussed in further detail below. For example, there is a need to provide electrical and physical coupling between base section 110 and cassette section 120. The electrical and physical coupling needs to be strong enough to withstand a product lifetime of insertion and removal cycles. In yet further example, an insertion should be relatively easy to perform and secure. In another example, there is a need to reduce noise and vibrations that may occur.

Cassette Packaging

In various embodiments, cassette section 120 includes one or more features directed to packaging the multiple storage modules. One feature provides an electrical and physical coupling between base section 110 and cassette section 120 while further providing energy transfer there between. Another feature provides a relatively easy insertion utilizing a tapered guide. To reduce noise and vibrations that may occur, as well as account from manufacturing process variation, cassette section 120 may include features that fill gaps or insulate components.

Figure 3:
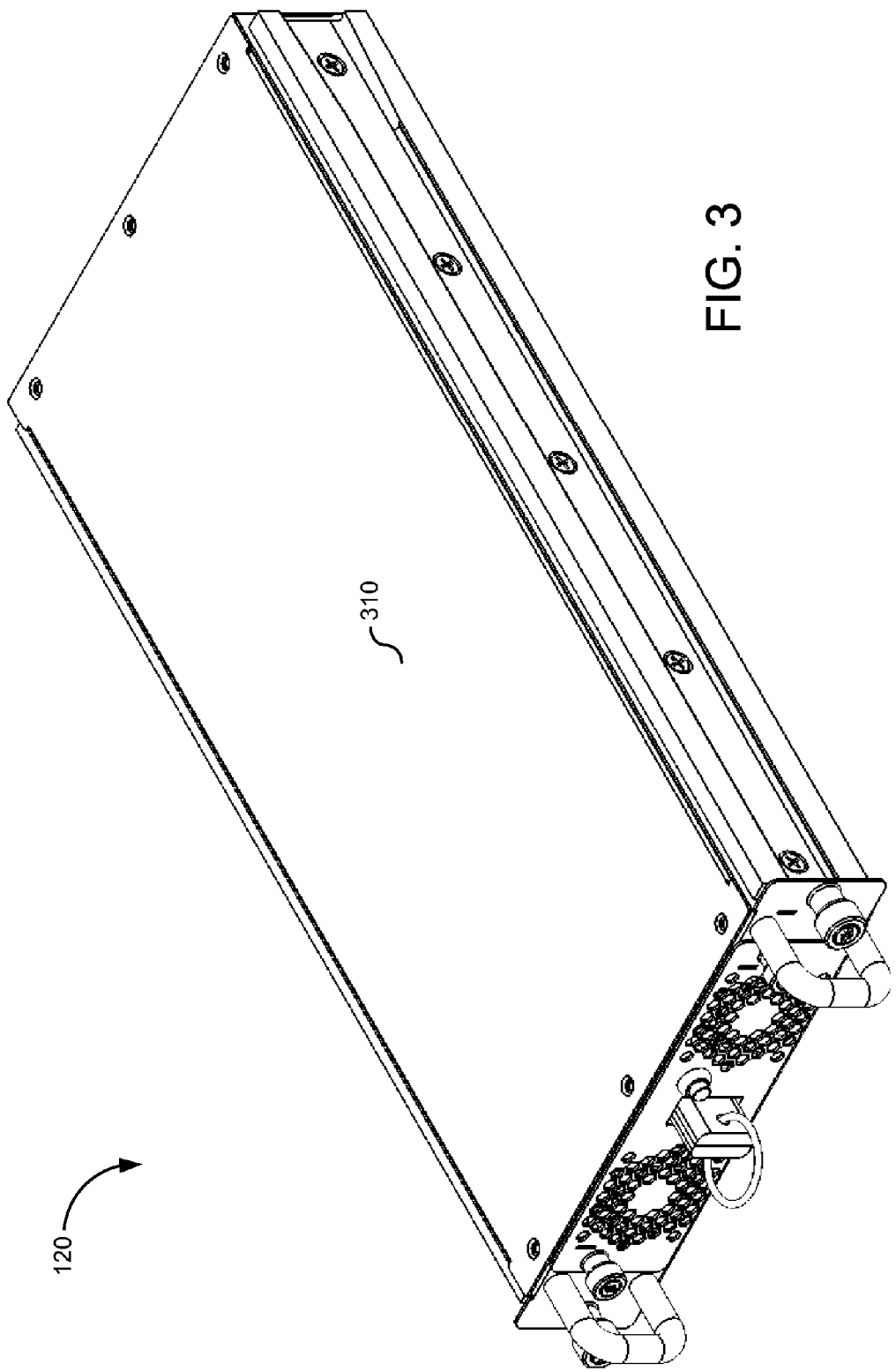
FIG. 3 is a diagram of the cassette of the high-density solid-state storage unit of FIG. 1 in one embodiment according to the present invention.

FIG. 3 is a diagram of cassette section 120 of high-density solid-state storage unit 100 of FIG. 1 in one embodiment according to the present invention. In various embodiments, cassette section 120 includes one or more features for providing access to and security of data stored within the multiple storage modules. Some of these features relate to the packaging of cassette section 120, such as how the data can be physically secured through removal of cassette section 120 from base section 110. For example, cassette section 120 can be physically removed from base section 110 may secured in a safe location, such as a vault or safe. In one aspect, cassette section 120 includes all data and metadata necessary to resume operation when re-inserted into base section 110.

Some of these features relate to the packaging of cassette section 120, such as how the multiple storage modules and other hardware elements of cassette section 120 remain undamaged during option of high-density solid-state storage unit 100. Mechanical motion of fans, thermal expansion and contraction, and other energy pollutions can damage sensitive components, electrical connections, or corrupt data. In one aspect, cassette section 120 includes one or more points at which heat and vibration may be transferred to base section 110 allowing components of cassette section 120 to operate within optimal conditions.

In various embodiments, some of these features relate to the security of data stored within cassette section 120, such as how cassette section 120 incorporates a trusted platform model that enables access to encrypted data stored within. Even with cassette section 120 physically removed from base section 110 and secured in a safe location, a user may still further remove the trusted platform module (or key) and store the key in a separate location. Because cassette section 120 may include all data and metadata necessary to resume operation when inserted into base section 110, a combination of the key and cassette section 120 are required.

Accordingly, cassette section 120 may be packaged to secure the data by providing an optimal environment at which elements may operate. Furthermore, cassette section 120 may be physically removed from base section 110 to secure the data from theft, fire, or other physical damage. Additionally, the key to cassette section 120 may be physically removed allowing cassette 120 to remain in base section 110 which securing the data from unauthorized access.

Referring again to FIG. 3, cassette section 120 may include top plate 310 and a bottom plate (not shown) that can be removed to allow access to internal components. In various embodiments, cassette section 120 includes a layer of gap filling material between the internal components and the top plate. Some examples of the gap filling material include foam or other vibration/acoustic dampening materials. Cassette section 120 may also include a layer of gap filling material between the internal components and the bottom plate. The gap filling material can further account for process variation in the manufacturing process while isolating components and/or structural elements from one another. The gap filling material may further provide for vibration compensation of internal components of cassette section 120, such as fans and the like, that are required for optimal operation. Cassette section 120 further may include other traditional elements, such as screws, buttons, latches, access ports, and the like that serve one or more purposes. Cassette section 120 may further include one or more tamper resistant or temper evident features.

Figure 4A:
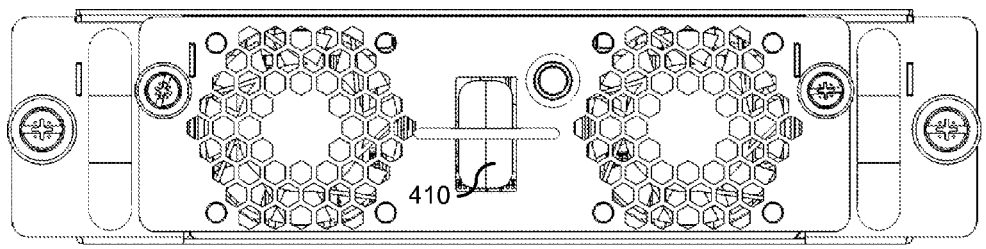
FIGS. 4A-4D are different views illustrating the cassette of FIG. 3 in one embodiment according to the present invention.

FIGS. 4A-4D are different views illustrating cassette section 120 of FIG. 3 in one embodiment according to the present invention. For example, FIG. 4A depicts a front view of cassette section 120. Cassette section 110 includes one or more vents at which one or more fans may be mounted to blow air inwards into cassette section 110. FIG. 4A illustrates one or more screws for securing cassette section 120 to base section 110 as well as one or more screws for securing a front plate to cassette section 120.

FIG. 4A also depicts one embodiment of a trusted platform module (TPM) (also referred to as a "key" in this disclosure). The TPM or key may be used to secure the data stored within a plurality of high-density flash-based storage modules. The key may take a variety of forms. In this example, the key is depecited as a universal serial bus (USB) style thumb drive or fob. There are several types of USB connectors, including some that have been added while USB specifications have progressed. The original USB specification details Standard-A and Standard-B plugs and receptacles. The USB 2.0 specification added Mini-B plugs and receptacles.

The TPM or key may utilize a standard of custom pin configuration of the USB style connectors. In general, a USB 2.0 Standard-A type of USB plug is a flattened rectangle that inserts into a USB 2.0 Standard-A type receptacle. A Standard-B plug has a square shape with bevelled exterior corners.

Figure 4B:
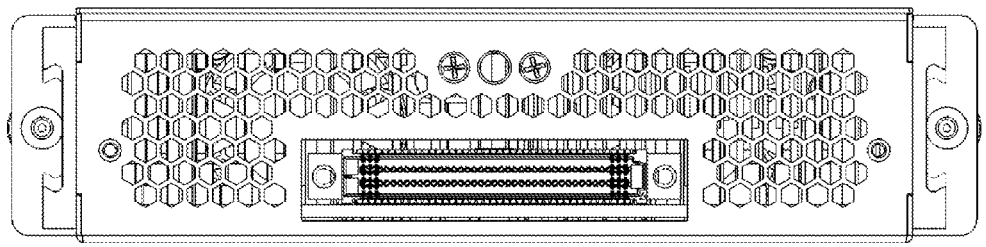
Figure 4C:
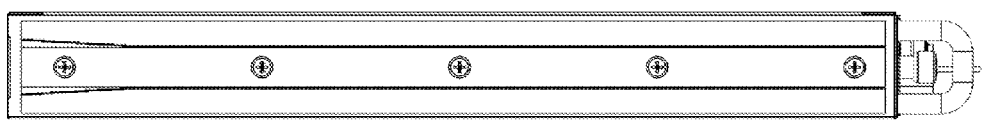
Figure 4D:
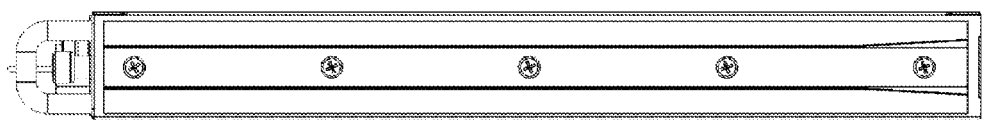

FIG. 4B depicts a back view of high-density solid-state storage unit 100 opposing the front view of FIG. 4A. As can be seen, cassette section 110 includes one or more vents through which air is transferred from cassette section 120 to base section 110. Cassette section 120 may include one or more interfaces that facilitate connections (both structural and electrical) to base section 110. FIG. 4C depicts a left view of cassette section 120. Cassette section 120 may include one or more openings, interfaces, and the like. FIG. 4D depicts a right view of cassette section 120. In these examples, cassette section 120 includes one or more mechanisms, such as guides and posts, that facilitate the interconnection with base section 110.

Figure 5:
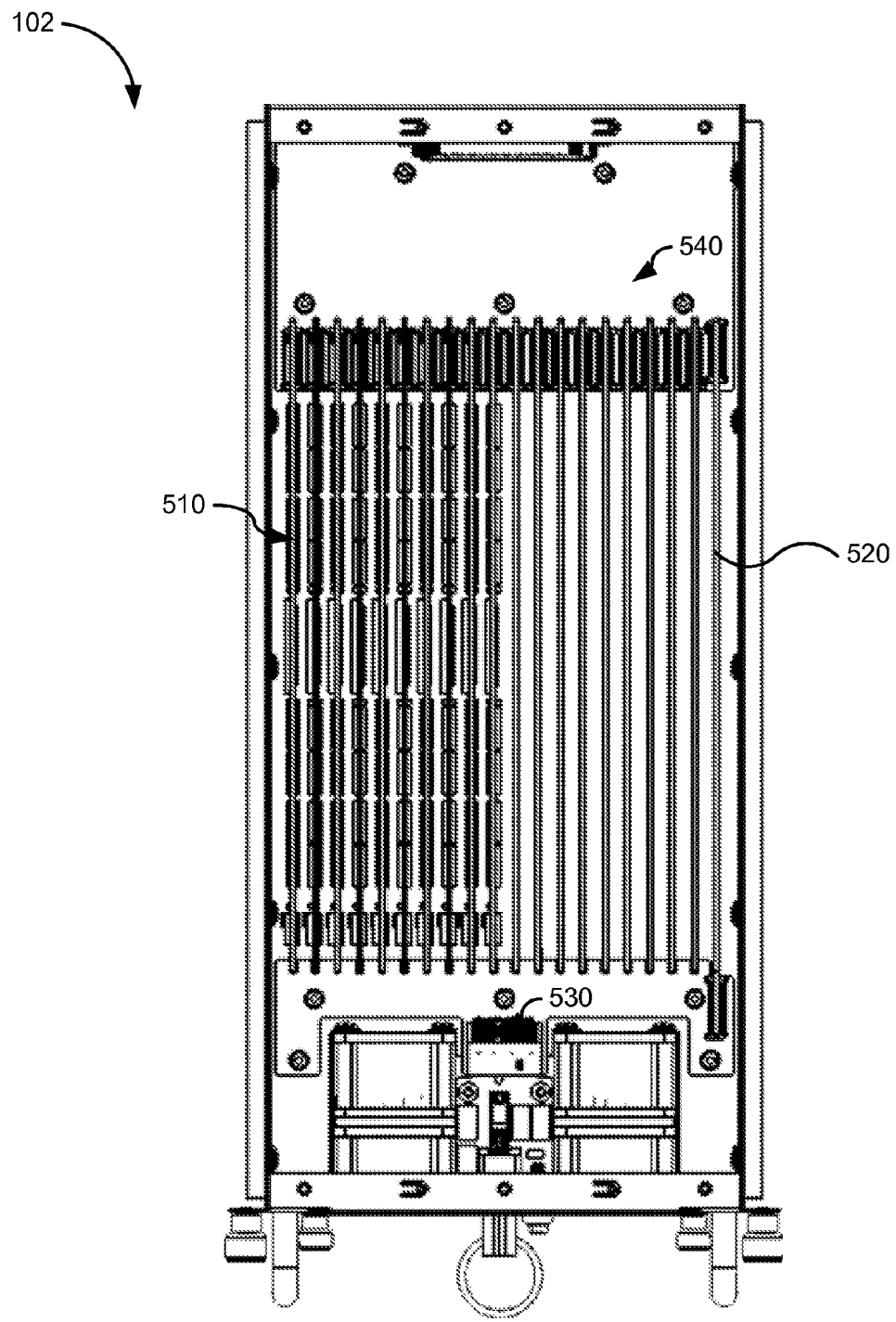
FIG. 5 is a diagram illustrating the packaging of various internal elements of the cassette of FIG. 1 in one embodiment according to the present invention.

FIG. 5 is a diagram illustrating the packaging of various internal elements of cassette section 120 of FIG. 1 in one embodiment according to the present invention. FIG. 5 depicts a top view of cassette section 120 with top plate 310 removed. Cassette section 120 typically includes multiple storage modules 510 arranged side-by-side in a vertical orientation.

Storage modules 510 can be used with high-density solid-state storage unit 100. For example, storage modules 510 may include a flash controller and one or more flash modules. The flash controller is representative of one or more processors, FPGAs, ASICs, or other microcontrollers that include hardware and/or software elements configured for executing logic or program code or for providing application-specific functionality. Flash modules are representative of flash memory modules or other solid-state devices (SSDs). Some examples of storage modules 510 are provided by Skyera, Inc. of San Jose, Calif.

To maximize the packaging of storage modules 510, cassette section 120 includes bridge board 520. Bridge board 520 is configured to provide an electrical power connection between front section 530 of cassette section 120 and rear section 540 of cassette section 120 utilizing substantially the same form factor as one of storage modules 510. Front section 530 may include components configured to interface with the TMP or key as well as to operate one or more fans, buttons, switches, and the like accessible to a user when interacting with the front of high-density solid-state storage unit 100. Rear section 540 may include components that configured to interface with components of base section 110. Rear section 540 may further extend as a circuit board that has receptacle interfaces for each of storage modules 510 and bridge board 520. Bridge board 520 may further be configured to provide communication lines between front section 530 of cassette section 120 and rear section 540 of cassette section 120.

Figure 6A:
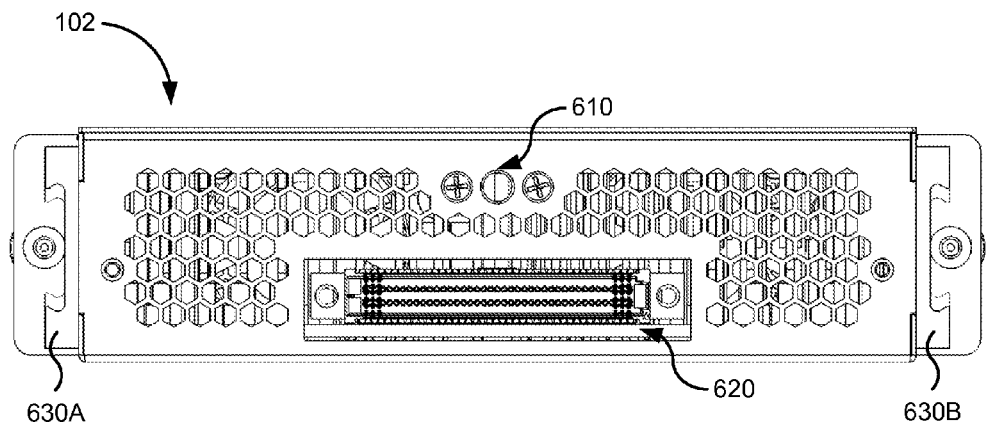
FIGS. 6A-6B are diagrams illustrating elements of the cassette of FIG. 3 that provide security and vibration reduction in one embodiment of the present invention.
Figure 6B:
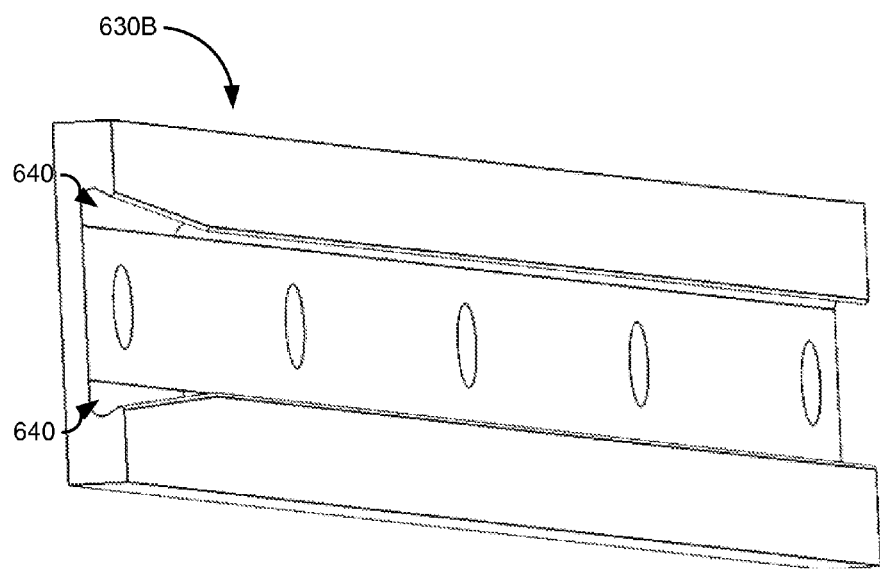

FIGS. 6A-6B are diagrams illustrating elements of cassette section 120 of FIG. 3 that provide security and vibration reduction in one embodiment of the present invention. In this example, FIG. 6A depicts interface 610 that may provide a physical connection point for receiving a connection from base section 110. Interface 620 may provide both a physical and an electrical connection to base section 110. Interface 620 is further configured to transfer vibrations or other harmonics associated with cassette section 120 into base section 110. Interface 620 thus reduces stress on components of cassette section 110, protects interface connectors, and physically secures cassette section 120 to base section 110.

FIG. 6A further depicts one or more guides 630A and 630B. Guides 630A and 630B are configured to facilitate the insertion and removal of cassette section 120 into base section 110. Guides 630A and 630B may further provide energy transfer from cassette section 120 to base section 110. FIG. 6B further depicts guide 630B. Guide 630B is tapered in areas 640 to allow cassette station 120 to pull itself into base station 110. Areas 640 located opposite each other form wedge receptors for receiving guide components of base section 110. Furthermore, guide 630B is rounded to form an upper and lower channel from front to back to self-guide as well as provide a better fit. Traditional guides are merely blocked at right angles and do not account for process variation. Thus, which the guides may fit into their receptors, they may not be entirely secure. In contrast, guides 630A and 630B provide a taper that ensures a secure fit. The secure fit provides protection against backing out as well as providing additional surface area through which energy and vibration transfer may occur.

As discussed above, cassette section 120 includes features in various aspects for providing security of data stored within. For example, cassette section 120 can be physically removed from base section 110 may secured in a safe location. In one aspect, cassette section 120 includes all data and metadata necessary to resume operation when inserted into base section 110. In another example, cassette section 120 includes one or more points at which heat and vibration may be transferred to base section 110 allowing components of cassette section 120 to operate within optimal conditions.

Dual Temperature Option

Cassette section 120 may implement a cooling system that draws air into the front of cassette section 120 and blows it across critical components such as storage modules 520 before exhausting the air out of the back of cassette section 120. Because the back of cassette section 120 vents into a portion of base section 110, one or more features may be provided for a plurality of environmental zones. These features may minimize interference between separate zones as well as consolidate the area needed for exhaust.

FIG. 7 is a diagram illustrating a cross section of cassette section 120 of FIG. 3 having dual temperature zones in one embodiment of the present invention. In this example, base station 110 is outfitted with one or more features to provide dual environmental zones. The need for multiple environmental zones may be based on requirements for optimal operation of certain components. Accordingly, some components may be able to operate under different conditions and these considerations may be used to design a more compact and efficient enclosure.

In this example, structure 710 of FIG. 7 is configured to separate airflow exiting cassette section 120 and airflow exiting base section 110. In this embodiment, structure 710 forms a ramp separating the two airflows into zone 720 and zone 730. Structure 710 may include one or more deformations, ramps, wings, blockages, enclosures, and the like that separate a space into a plurality of zones or partitions.

Therefore, components of cassette section 120 may be able to operate under different conditions from components of base section 110. Thus the cooling strategy of cassette section 110 may be different from the cooling strategy of base section 110 without incurring substantial interference with or comprising efficiency of another zone. Incorporating separate zones where at least one zone is designated for a removal cassette also allows for a more compact and efficient enclosure design, both of cassette 120 and base section 110.

Data Security

As discussed above, high-density solid-state storage unit 100 includes one or more features for securing the data stored within cassette 120, both physically and cryptographically. In one embodiment, high-density solid-state storage unit 100 utilizes a Trusted Platform Module (TPM). In various embodiments, the TPM or key is a specialized removable module utilizing a USB-style connector. The key includes hardware and/or information necessary for accessing data stored in storage modules 520 under its protection. The key can store encryption keys specific to cassette station 120. The key can also provide for platform integrity in that attest that high-density solid-state storage unit 100 has a specified hardware setup and is using specified software.

Figure 8:
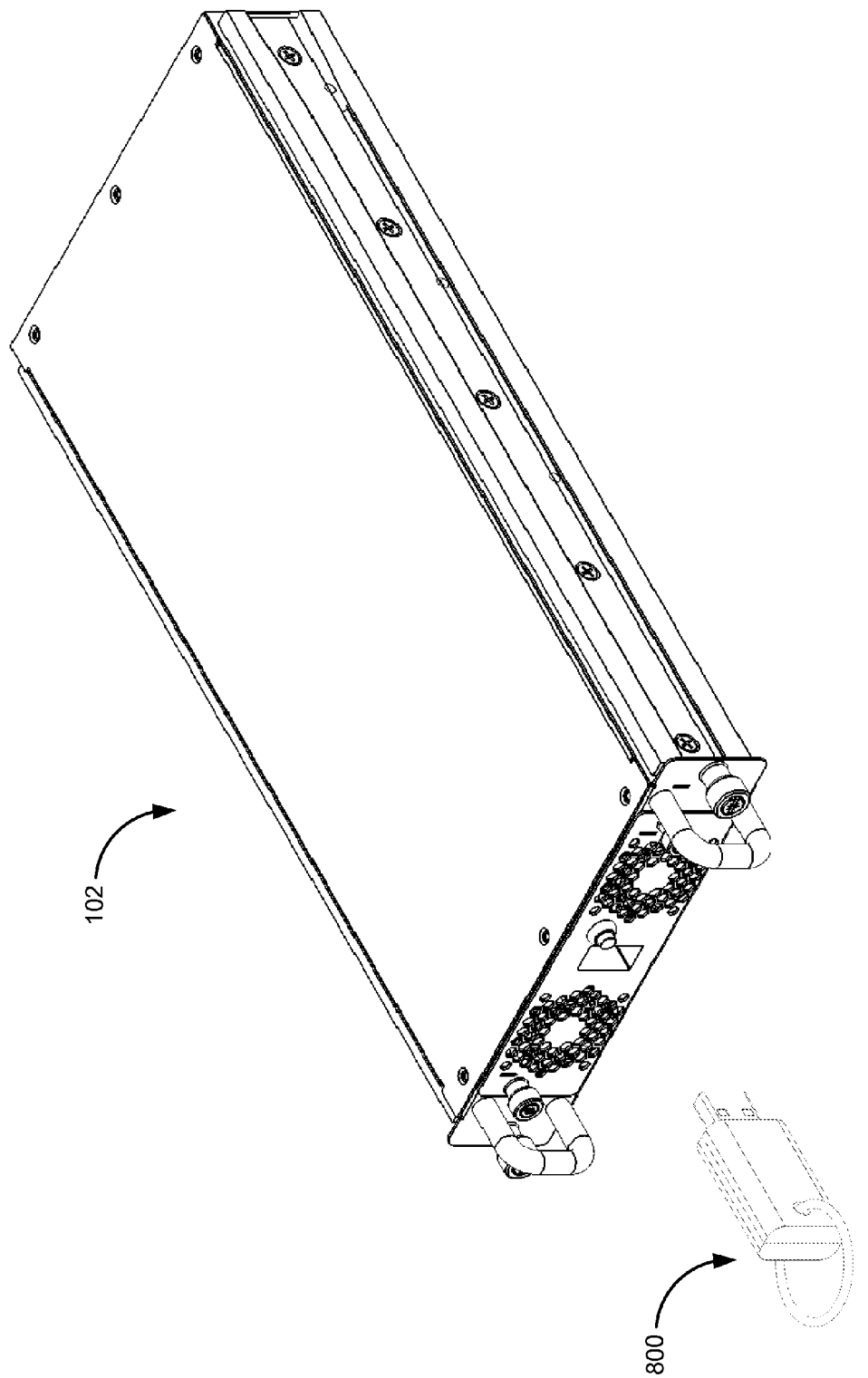
FIG. 8 is a diagram illustrating a data security feature of the cassette of FIG. 3 in one embodiment of the present invention.

FIG. 8 is a diagram illustrating a data security feature of cassette station 120 of FIG. 3 in one embodiment of the present invention. In this example, TPM chip 800 contains a key pair called the Endorsement Key (EK). The pair is maintained inside TPM chip 800 and cannot be accessed by software. The Storage Root Key (SRK) is created when a user or administrator takes ownership of the system. This key pair may be generated by TPM chip 800 based on the Endorsement Key and an owner-specified password. A second key, called an Attestation Identity Key (AIK) may be used to protect cassette station 120 against unauthorized firmware and software modification.

Accordingly, even if cassette section 120 is physically removed from base section 110 all data and metadata necessary to resume operation when inserted into base section 110 remains secured by TPM chip 800. Simply removing TPM chip 800 from cassette station 120 further preserves the security if the data even if physical access is later obtained to the storage modules within.

Thus, in various embodiments, data stored within cassette section 120 can be secured by removing TPM chip 800. Cassette 120 may be left within base section 110 while preventing unauthorized access. Even with cassette section 120 physically removed from base section 110, TPM chip 800 may be removed further stored in a separate location. Even if an unauthorized use reconnects cassette section 110 to base section 120, data stored within cassette section 120 remains encrypted and otherwise secured. In one aspect, cassette section 120 and base section 110 may refuse to operate without the presence of TPM chip 800. When cassette section 120 includes all data and metadata necessary to resume operation when inserted into base section 110, a combination of TPM chip 800 and cassette section 120 are required.

TPM chip 800 may take a variety of forms. In this example, TPM chip 800 is depecited as USB-style thumb drive or fob. TPM chip 800 includes a USB 2.0 Standard-A type of USB plug with a flattened rectangle that inserts into a USB 2.0 Standard-A type receptacle of cassette section 120. Most hardware-based security device that addresses boot process integrity or data protection are typically modules that connect to a system using a proprietary interface designed by the manufacture. Additionally, the modules are often constructed as small daughter board style cards or modules connected with tamper-evident or tamper resistant fasteners within the system's enclosures. TPM chip 800 provides a connector utilizing a well-known standard of construction. TPM chip 800 when embodied as a USB-style thumb drive or fob further provides something familiar to users.

CONCLUSION

Figure 9:
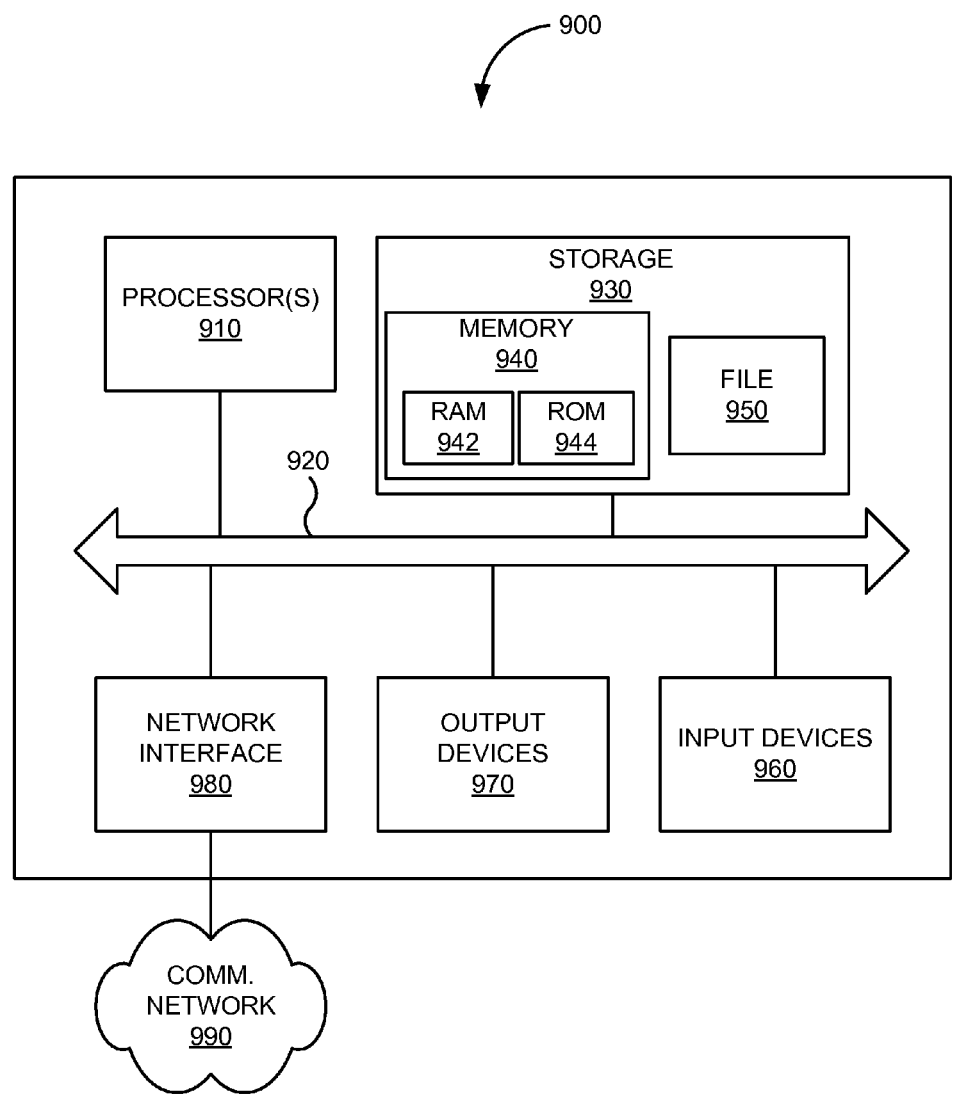
FIG. 9 is a simplified block diagram of a computer system that may be used to practice embodiments of the present invention.

FIG. 9 is a simplified block diagram of computer system 900 that may be used to practice embodiments of the present invention. As shown in FIG. 9, computer system 900 includes processor 910 that communicates with a number of peripheral devices via bus subsystem 920. These peripheral devices may include storage subsystem 930, comprising memory subsystem 940 and file storage subsystem 950, input devices 960, output devices 970, and network interface subsystem 980.

Bus subsystem 920 provides a mechanism for letting the various components and subsystems of computer system 900 communicate with each other as intended. Although bus subsystem 920 is shown schematically as a single bus, alternative embodiments of the bus subsystem may utilize multiple busses.

Storage subsystem 930 may be configured to store the basic programming and data constructs that provide the functionality of the present invention. Software (code modules or instructions) that provides the functionality of the present invention may be stored in storage subsystem 930. These software modules or instructions may be executed by processor(s) 910. Storage subsystem 930 may also provide a repository for storing data used in accordance with the present invention. Storage subsystem 930 may comprise memory subsystem 940 and file/disk storage subsystem 950.

Memory subsystem 940 may include a number of memories including a main random access memory (RAM) 942 for storage of instructions and data during program execution and a read only memory (ROM) 944 in which fixed instructions are stored. File storage subsystem 950 provides persistent (non-volatile) storage for program and data files, and may include a hard disk drive, a floppy disk drive along with associated removable media, a Compact Disk Read Only Memory (CD-ROM) drive, a DVD, an optical drive, removable media cartridges, and other like storage media.

Input devices 960 may include a keyboard, pointing devices such as a mouse, trackball, touchpad, or graphics tablet, a scanner, a barcode scanner, a touchscreen incorporated into the display, audio input devices such as voice recognition systems, microphones, and other types of input devices. In general, use of the term "input device" is intended to include all possible types of devices and mechanisms for inputting information to computer system 900.

Output devices 970 may include a display subsystem, a printer, a fax machine, or non-visual displays such as audio output devices, etc. The display subsystem may be a cathode ray tube (CRT), a flat-panel device such as a liquid crystal display (LCD), or a projection device. In general, use of the term "output device" is intended to include all possible types of devices and mechanisms for outputting information from computer system 900.

Network interface subsystem 980 provides an interface to other computer systems, devices, and networks, such as communications network 990. Network interface subsystem 980 serves as an interface for receiving data from and transmitting data to other systems from computer system 900. Some examples of communications network 990 are private networks, public networks, leased lines, the Internet, Ethernet networks, token ring networks, fiber optic networks, and the like.

Computer system 900 can be of various types including a personal computer, a portable computer, a workstation, a network computer, a mainframe, a kiosk, or any other data processing system. Due to the ever-changing nature of computers and networks, the description of computer system 900 depicted in FIG. 9 is intended only as a specific example for purposes of illustrating the preferred embodiment of the computer system. Many other configurations having more or fewer components than the system depicted in FIG. 9 are possible.

Although specific embodiments of the invention have been described, various modifications, alterations, alternative constructions, and equivalents are also encompassed within the scope of the invention. The described invention is not restricted to operation within certain specific data processing environments, but is free to operate within a plurality of data processing environments. Additionally, although the present invention has been described using a particular series of transactions and steps, it should be apparent to those skilled in the art that the scope of the present invention is not limited to the described series of transactions and steps.

Further, while the present invention has been described using a particular combination of hardware and software, it should be recognized that other combinations of hardware and software are also within the scope of the present invention. The present invention may be implemented only in hardware, or only in software, or using combinations thereof.

The specification and drawings are, accordingly, to be regarded in an illustrative rather than a restrictive sense. It will, however, be evident that additions, subtractions, deletions, and other modifications and changes may be made thereunto without departing from the broader spirit and scope of the invention as set forth in the claims.

Various embodiments of any of one or more inventions whose teachings may be presented within this disclosure can be implemented in the form of logic in software, firmware, hardware, or a combination thereof. The logic may be stored in or on a machine-accessible memory, a machine-readable article, a tangible computer-readable medium, a computer-readable storage medium, or other computer/machine-readable media as a set of instructions adapted to direct a central processing unit (CPU or processor) of a logic machine to perform a set of steps that may be disclosed in various embodiments of an invention presented within this disclosure. The logic may form part of a software program or computer program product as code modules become operational with a processor of a computer system or an information-processing device when executed to perform a method or process in various embodiments of an invention presented within this disclosure. Based on this disclosure and the teachings provided herein, a person of ordinary skill in the art will appreciate other ways, variations, modifications, alternatives, and/or methods for implementing in software, firmware, hardware, or combinations thereof any of the disclosed operations or functionalities of various embodiments of one or more of the presented inventions.

The disclosed examples, implementations, and various embodiments of any one of those inventions whose teachings may be presented within this disclosure are merely illustrative to convey with reasonable clarity to those skilled in the art the teachings of this disclosure. As these implementations and embodiments may be described with reference to exemplary illustrations or specific figures, various modifications or adaptations of the methods and/or specific structures described can become apparent to those skilled in the art. All such modifications, adaptations, or variations that rely upon this disclosure and these teachings found herein, and through which the teachings have advanced the art, are to be considered within the scope of the one or more inventions whose teachings may be presented within this disclosure. Hence, the present descriptions and drawings should not be considered in a limiting sense, as it is understood that an invention presented within a disclosure is in no way limited to those embodiments specifically illustrated.

Accordingly, the above description and any accompanying drawings, illustrations, and figures are intended to be illustrative but not restrictive. The scope of any invention presented within this disclosure should, therefore, be determined not with simple reference to the above description and those embodiments shown in the figures, but instead should be determined with reference to the pending claims along with their full scope or equivalents.

What is claimed is:

1. A data storage unit comprising:
    a base section;
    a cassette section configured to be removably attached to the base section and having an interface through which a plurality of solid-state storage modules located within the cassette section are accessible to the base section;
    wherein the base section comprises one or more structures configured to separate airflow exiting the base section from airflow exiting the cassette section, wherein the one or more structures enables the cassette section to operate under different temperature conditions from the base section; and
    a trusted platform module removably attached to the cassette section utilizing a universal serial bus (USB) style connector, the trusted platform module configured:
        to manage access to data stored in the plurality of solid-state storage modules from the base section; and
        to provide security to the solid-state storage modules on the cassette section by authorizing operation of the cassette section and the base section when the cassette section is connected to the base section.

2. The data storage unit of claim 1 wherein the interface is configured to provide both an electrical connection between the cassette section and the base section as well as energy transfer from the cassette section to the base section.

3. The data storage unit of claim 1 wherein the cassette section further includes one or more guides configured to guide insertion of the cassette section into the base section, each guide having a taper from one end of the cassette section toward another end of the cassette section, the taper configured to provide self-guiding of the cassette section upon insertion into the base section.

4. The data storage unit of claim 3 wherein the one or more guides are configured to provide energy transfer to the base section and the base section is configured to receive the energy transfer through the one or more guides.

5. The data storage unit of claim 3 wherein the one or more guides include a first wedge receptor opposite a second wedge receptor.

6. The data storage unit of claim 1 wherein the cassette section further includes a gap filling material positioned between one or more internal components of the cassette section and an enclosing plate of the cassette section.

7. The data storage unit of claim 6 wherein the gap filling material is further configured to reduce vibration of the cassette section.

8. The data storage unit of claim 1 wherein the base section includes one or more structures forming a plurality of environmental zones, at least one of the plurality of environmental zones designated for the cassette section.

9. A data cassette comprising:
a plurality of solid-state storage modules;
a first interface through which the plurality of solid-state storage modules located within the data cassette are accessible to a base section;
wherein the data cassette is configured to implement a cooling system that draws air into the front of the data cassette and blows the air across components of the data cassette before exhausting the air out of the back of the data cassette, which vents into a portion of the base section designated for airflow from the cassette section; and
a second interface configured to accept a removable trusted platform module utilizing a universal serial bus (USB) style connector, the trusted platform module configured to:
manage access to data stored in the plurality of solid-state storage modules from the base section; and
to provide security to the solid-state storage modules on the cassette section by authorizing operation of the cassette section and the base section when the cassette section is connected to the base section.

10. The data cassette of claim 9 wherein the first interface is configured to provide both an electrical connection between the data cassette and the base section as well as energy transfer from the data cassette to the base section.

11. The data cassette of claim 9 further including one or more guides configured to guide insertion of the data cassette into the base section, each guide having a taper from one end of the data cassette toward another end of the data cassette, the taper configured to provide self-guiding of the data cassette upon insertion into the base section.

12. The data cassette of claim 11 wherein the one or more guides are configured to provide energy transfer to the base section and the base section is configured to receive the energy transfer through the one or more guides.

13. The data cassette of claim 11 wherein the one or more guides include a first wedge receptor opposite a second wedge receptor.

14. The data cassette of claim 9 further including a gap filling material positioned between one or more internal components of the cassette section and an enclosing plate of the data cassette.

15. The data cassette of claim 14 wherein the gap filling material is further configured to reduce vibration of the data cassette.

* * * * *